(12) United States Patent
Pei et al.

(10) Patent No.: US 10,411,217 B2
(45) Date of Patent: Sep. 10, 2019

(54) OLED DEVICE AND PREPARATION METHOD THEREFOR AND DISPLAY APPARATUS

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Fengwei Pei, Beijing (CN); Ziyi Zhao, Beijing (CN); Jinzhong Zhang, Beijing (CN); Ninghao Quan, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/510,107

(22) PCT Filed: Apr. 12, 2016

(86) PCT No.: PCT/CN2016/079033
§ 371 (c)(1),
(2) Date: Mar. 9, 2017

(87) PCT Pub. No.: WO2016/188247
PCT Pub. Date: Dec. 1, 2016

(65) Prior Publication Data
US 2017/0301880 A1    Oct. 19, 2017

(30) Foreign Application Priority Data
May 27, 2015  (CN) .......................... 2015 1 0280602

(51) Int. Cl.
*H01L 51/52* (2006.01)
*H01L 51/56* (2006.01)
(Continued)

(52) U.S. Cl.
CPC ...... *H01L 51/5234* (2013.01); *H01L 51/0083* (2013.01); *H01L 51/5004* (2013.01);
(Continued)

(58) Field of Classification Search
CPC ............ H01L 51/5221; H01L 51/5234; H01L 51/5092
See application file for complete search history.

(56) References Cited

U.S. PATENT DOCUMENTS

2002/0182441 A1* 12/2002 Lamansky .......... C07F 15/0033
                                                            428/690
2003/0189401 A1* 10/2003 Kido ..................... C07C 211/58
                                                            313/504
(Continued)

FOREIGN PATENT DOCUMENTS

CN      1610132 A     4/2005
CN    103325948 A     9/2013
(Continued)

OTHER PUBLICATIONS

International Search Report and Written Opinion dated Jun. 13, 2016; PCT/CN2016/079033.
(Continued)

*Primary Examiner* — Ngan V Ngo
(74) *Attorney, Agent, or Firm* — Ladas & Parry LLP

(57) ABSTRACT

An OLED device and a manufacturing method thereof and a display apparatus are provided. The OLED device includes an anode, a cathode, and a functional layer disposed between the anode and the cathode, the cathode includes an organometallic layer, and the organometallic layer includes an
(Continued)

organic metal. The OLED device is capable of increasing the stability of the cathode in the OLED device and reducing the cost of the OLED device.

15 Claims, 3 Drawing Sheets

(51) Int. Cl.
H01L 51/50 (2006.01)
H01L 51/00 (2006.01)
H01L 27/32 (2006.01)

(52) U.S. Cl.
CPC .......... *H01L 51/5092* (2013.01); *H01L 51/52* (2013.01); *H01L 51/5221* (2013.01); *H01L 51/56* (2013.01); *H01L 27/322* (2013.01); *H01L 27/3211* (2013.01); *H01L 2251/5315* (2013.01); *H01L 2251/552* (2013.01)

(56) References Cited

U.S. PATENT DOCUMENTS

| | | | | |
|---|---|---|---|---|
| 2004/0119406 | A1* | 6/2004 | Kobayashi | H01L 27/3211 313/506 |
| 2005/0012448 | A1* | 1/2005 | Ke | H01L 51/5253 313/504 |
| 2005/0081907 | A1* | 4/2005 | Lewis | C23C 18/08 136/243 |
| 2010/0051902 | A1* | 3/2010 | Hiura | B82Y 10/00 257/13 |
| 2010/0096622 | A1* | 4/2010 | Iizumi | H01L 51/5012 257/40 |
| 2011/0033677 | A1* | 2/2011 | Shin | B82Y 30/00 428/201 |
| 2011/0141550 | A1* | 6/2011 | Ishida | G02F 1/136204 359/296 |
| 2011/0221061 | A1* | 9/2011 | Prakash | H05B 33/28 257/749 |
| 2012/0025180 | A1* | 2/2012 | Matsumoto | H01L 51/5096 257/40 |
| 2014/0009514 | A1* | 1/2014 | Abe | H01L 29/78693 345/690 |
| 2017/0229525 | A1* | 8/2017 | Kamimura | H01L 27/3223 |
| 2018/0047917 | A1* | 2/2018 | Inoue | C07D 403/14 |
| 2018/0075806 | A1* | 3/2018 | Yamazaki | G09G 3/20 |
| 2018/0108711 | A1* | 4/2018 | Teraguchi | H04N 13/0452 |
| 2018/0108854 | A1* | 4/2018 | Yamazaki | H01L 51/5016 |

FOREIGN PATENT DOCUMENTS

| | | |
|---|---|---|
| CN | 103865220 A | 6/2014 |
| CN | 104201290 A | 12/2014 |
| CN | 104993066 A | 10/2015 |
| JP | 2008-111941 A | 5/2008 |
| JP | 5326093 B2 | 10/2013 |

OTHER PUBLICATIONS

First Chinese Office Action dated Oct. 10, 2016, Appln. No. 201510260602.1.

Second Chinese Office Action dated Mar. 16, 2017; Appln. No. 201510280602.1.

* cited by examiner

OLED DEVICE AND PREPARATION METHOD THEREFOR AND DISPLAY APPARATUS

TECHNICAL FIELD

Embodiments of the present disclosure relate to an organic light emitting diode (OLED) device, a manufacturing method thereof and a display apparatus.

BACKGROUND

An OLED (organic light emitting diode) display device is a self-luminous display. Compared with an LCD (liquid crystal display), an OLED display device does not require a backlight, and thus a thickness of the OLED display device is thinner than that of the LCD. Besides, OLED display devices are increasingly applied to a variety of high performance display fields for their various advantages such as great brightness, low power consumption, wide viewing angle, fast response, wide operation temperature range and the like.

The luminescence mechanism of the OLED devices is that, under an action of an applied electric field, electrons and holes are injected into an organic light-emitting material from a cathode and an anode respectively, electrons and holes migrate, recombine and attenuate in the organic light-emitting material to emit light. Because the electron affinity of the organic light-emitting material is far smaller than that of a metal material or an inorganic material, a work function of the cathode material must be low enough to meet the requirement of injecting electrons into the organic light-emitting material efficiently. Currently, the cathode of the OLED device is generally made of a metal or a metal alloy with a low work function.

However, in the case that the cathode of the OLED device is made of a metal or a metal alloy, on the one hand, the metal or the metal alloy tends to deteriorate in the atmospheric environment, so that the quality of OLED devices are degraded; on the other hand, the cost of the metal or the metal alloy is high.

SUMMARY

An organic light emitting diode (OLED) device is provided in the embodiments of the present disclosure in one aspect, and the OLED device comprises an anode, a cathode, and a functional layer disposed between the anode and the cathode, the cathode includes an organometallic layer, and the organometallic layer includes an organic metal. In some embodiments, a work function of the organometallic layer ranges from 2.9 eV to 3.7 eV.

A display apparatus is provided in the embodiments of the present disclosure in another aspect, and the display apparatus includes any one of the OLED devices as described above.

A manufacturing method of an OLED device is provided in the embodiments of the present disclosure in still another aspect, and the method includes: forming an anode, a cathode, and a functional layer disposed between the anode and the cathode on a base substrate through a patterning process, wherein the cathode comprises an organometallic layer, and the organometallic layer comprises an organic metal.

BRIEF DESCRIPTION OF THE DRAWINGS

In order to clearly illustrate the technical solutions of the embodiments of the present disclosure, the drawings of the embodiments will be briefly described below. Apparently, the drawings described below relate to only some embodiments of the present disclosure, and thus are not limitative of the present disclosure.

REFERENCE NUMERALS

01—transparent substrate; 10—anode; 101—transparent conductive layer; 102—anode metal layer; 11—cathode; 110—organometallic layer; 12—functional layer; 120—light-emitting layer; 130—electron transport layer; 131—electron injection layer; 140—hole transport layer; 141—hole injection layer; 20—planarization layer; 21—electron blocking layer; 30—thin film transistor; 301—drain electrode; 302—gate electrode; 303—gate insulation layer; 304—semiconductor active layer; 305—source electrode.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
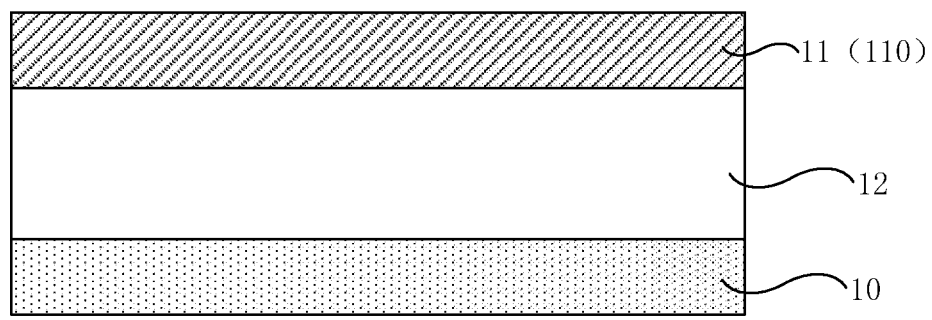
FIG. 1 is a schematic structure diagram of an OLED device provided by an embodiment of the present disclosure.

Embodiments of the present disclosure provide an organic light emitting diode (OLED) device, as shown in FIG. 1, the OLED device comprises an anode 10, a cathode 11, and a functional layer 12 disposed between the anode 10 and the cathode 11. In the present embodiment, the cathode 11 comprises an organometallic layer, and the organometallic layer comprises an organic metal. In some embodiments, a work function of the organometallic layer ranges from 2.9 eV to 3.7 eV.

Figure 2:
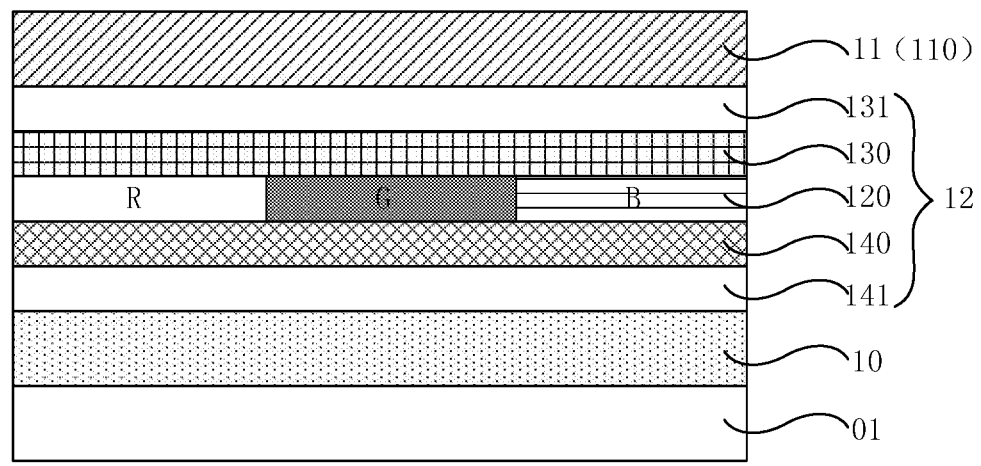
FIG. 2 is a schematic structure diagram of the OLED device illustrated in FIG. 1 after a functional layer 12 in the OLED device is refined.

It should be noted that, firstly, the functional layer 12 at least comprises a light-emitting layer 120, as shown in FIG. 2, and the functional layer 12 further comprises an electron transport layer 130 and a hole transport layer 140; further, in order to improve the efficiency of injecting electrons and holes into the light-emitting layer, the functional layer 12 further comprises an electron injection layer 131 provided between the cathode 11 and the electron transport layer 130, and a hole injection layer 141 provided between the hole transport layer 140 and the anode 10. The specific structure of the functional layer 12 is not limited in the present disclosure.

In some embodiments, a pixel is generally constituted by sub-pixels of at least red (R), green (G), and blue (B); the light-emitting layers 120 of the three sub-pixels emit red light, green light and blue light respectively for achieving color display. Alternatively, the above light-emitting layer 120, for example, also emits white light, and then a color filter layer at least comprising red color filter, green color filter and blue color filter is provided on the light emitting side of the light-emitting layer 120 to achieve color display. The schemes employed to achieve color display are not limited in the present disclosure. However, in the drawings corresponding to the following embodiments, the light-emitting layer 120 capable of emitting red light, green light or blue light is taken as an example.

Secondly, the anode 10 of the OLED device described above can be formed on a transparent substrate 01. The transparent substrate 01, for example, is made of a transparent hard resin or a transparent glass substrate. Alternatively, for a flexible display substrate, the above transparent substrate 01, for example, is a flexible substrate made of a transparent resin material.

Thirdly, the term "organometallic layer" refers to a layer structure formed of an organometallic material. The term "organic metal" is also known as an organometallic conductor or an organometallic compound.

An embodiment of the present disclosure provides an OLED device, and the OLED device comprises an anode, a cathode, and a functional layer disposed between the anode and the cathode. In some embodiments, the cathode has an organometallic layer and the organometallic layer comprises an organic metal. In some embodiments, a work function of the organometallic layer ranges from 2.9 eV to 3.7 eV. In this case, in one aspect, in the case that the OLED device is a top emission type device, the luminous efficiency of the OLED device may be improved in the case that the cathode is made of an organometallic layer with a high transmittance compared with the case that the cathode is made of a metal element or an alloy. In another aspect, the luminous principle of the OLED device is that electrons and holes are injected from the cathode and the anode respectively and then combined in the functional layer to generate excitons for luminescence. Because the organic material for forming the functional layer has a small electron affinity, in the case that the work function of the organometallic layer ranges from 2.9 eV to 3.7 eV, the cathode made of the organometallic layer has a small work function, which is helpful for improving the transmission performance of electrons, so that the electrons can be injected into the functional layer more efficiently in the light-emitting process of the OLED device. In a still further aspect, the organometallic layer has a lower cost and more stable chemical properties than metal elements or alloys.

The present disclosure includes the following embodiments:

First embodiment: an OLED device comprises an anode, a cathode, and a functional layer disposed between the anode and the cathode, and the cathode comprises an organometallic layer, and the organometallic layer comprises an organic metal.

Second embodiment: in the OLED device according to the first embodiment, a work function of the organometallic layer ranges from 2.9 eV to 3.7 eV.

Third embodiment: in the OLED device according to the first embodiment or the second embodiment, the organic metal is at least one selected from the group consisting of: ferrocene or an organic conductive material comprising a ferrocenyl group.

Fourth embodiment: in the OLED device according to any one of the first embodiment to the third embodiment, the cathode further comprises a cathode metal layer, and the cathode metal layer comprises a metal.

Fifth embodiment: in the OLED device according to the fourth embodiment, the cathode metal layer is disposed on a surface of the organometallic layer away from the anode, and the cathode metal layer is in direct contact with the organometallic layer.

Sixth embodiment: in the OLED device according to the fourth embodiment or the fifth embodiment, the cathode metal layer comprises at least one of: silver, magnesium, aluminum, calcium, lithium, or gadolinium.

Seventh embodiment: in the OLED device according to any one of the first embodiment to the sixth embodiment, a thickness of the organometallic layer ranges from 50 Å to 100 Å.

Eighth embodiment: in the OLED device according to the first embodiment, the anode comprises two transparent conductive layers and an anode metal layer disposed between the two transparent conductive layers.

Ninth embodiment: in the OLED device according to any one of the first embodiment to the eighth embodiment, the functional layer comprises a light-emitting layer.

Tenth embodiment: in the OLED device according to any one of the first embodiment to the ninth embodiment, the functional layer further comprises at least one selected from the group consisting of: an electron injection layer, an electron transport layer, a hole injection layer or a hole transport layer.

Eleventh embodiment: a display apparatus comprises the OLED device according to any one of the first embodiment to the tenth embodiment.

Twelfth embodiment: a manufacturing method of an OLED device comprises: forming an anode, a cathode, and a functional layer disposed between the anode and the cathode on a base substrate through a patterning process, and the cathode comprises an organometallic layer, and the organometallic layer comprises an organic metal.

Thirteenth embodiment: the method according to the twelfth embodiment, a work function of the organometallic layer ranges from 2.9 eV to 3.7 eV.

Fourteenth embodiment: the method according to the twelfth embodiment or the thirteenth embodiment, the organic metal is at least one selected from the group consisting of: ferrocene or an organic conductive material comprising a ferrocenyl group.

Fifteenth embodiment: the method according to any one of the twelfth embodiment to the fourteenth embodiment, the base substrate is a transparent substrate.

Sixteenth embodiment: the method according to any one of the twelfth embodiment to the fifteenth embodiment, the organometallic layer is formed on the substrate through a patterning process, and a thickness of the organometallic layer ranges from 50 Å to 100 Å.

Seventeenth embodiment: the method according to the sixteenth embodiment, a cathode metal layer is further formed on the organometallic layer through a patterning process, and a thickness of the cathode metal layer ranges from 120 Å to 160 Å.

The specific structures of the above OLED devices will be described in detail with reference to the following specific embodiments.

First Embodiment

The OLED device provided in the present embodiment comprises the anode 10, the cathode 11, and the functional layer 12. The organometallic layer 110 used for forming the cathode 11 is ferrocene or an organic conductive material comprising a ferrocenyl group.

Using ferrocene or the organic conductive material comprising the ferrocenyl group as the main material to form the cathode 11 has the following advantages.

On the one hand, ferrocene or the organic conductive material containing a ferrocenyl group has a good chemical stability.

Specifically, ferrocene, for example, is obtained by reacting cyclopentene with iron (Fe) at 300° C. in a nitrogen atmosphere ($N_2$). The specific chemical reaction is as follows:

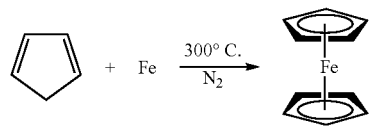

It can be seen that the valence of the iron atoms of oxidation state in the center of the ferrocene is +2, and each cyclopentadiene ring has a single negative charge. Thus, each ring contains six π electrons, which meets the requirement of 4n+2 electrons according to the Hückel's rule (n is a positive integer), and each ring has aromatic. 6 electrons of each ring multiplied by 2 plus the six d-electrons of the two valence iron ($Fe^{2-}$) lead to the result exactly equal to 18, which corresponds to the 18 electron rule. Therefore, ferrocene is quite stable in the air and can withstand high temperature heating of 470° C.; in boiling water, 10% boiling alkali solution or concentrated hydrochloric acid boiling solution, ferrocene is neither dissolved nor decomposed. In addition, ferrocene has a structure of one iron atom is disposed between two cyclopentadienyl rings (for example, disposed between two parallel cyclopentadiene rings). In a solid state, the two cyclopentadienyl rings are staggered to form a staggered conformation, and the two cyclopentadienyl rings are rotate about the vertical axis in the case that the temperature rise. Ferrocene has stable chemical properties similar to that of aromatic compounds. However, the cathode 11 made of a metal element or alloy has poorer stability in the atmosphere than the cathode 11 made of ferrocene.

In addition, rings of ferrocene may undergo a electrophilic substitution, such as mercuration, alkylation, acylation and the like, so as to form an organic conductive material comprising a ferrocenyl group, for example, ferrocene reacting with n-butyllithium can produce 1,1'-dilithioferrocene. The specific chemical reaction is as follow:

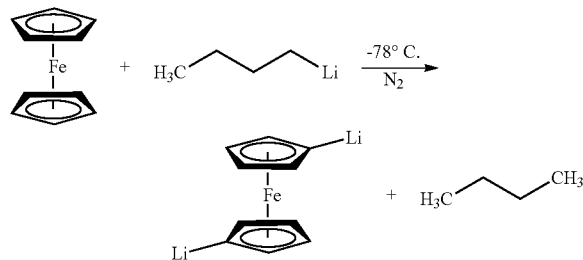

To sum up, because ferrocene has a good chemical stability, the cathode 11 of the OLED device made of ferrocene or the organic conductive material comprising the ferrocenyl group can improve the stability and prolong service life of the OLED device.

On the other hand, ferrocene or the organic conductive material comprising the ferrocenyl group has a low work function.

Through the experimental data, it is concluded that ferrocene has a HOMO (Highest Occupational Molecular) of 4.67 eV and an LOMO (Lowest Unoccupied Molecular) of 0.98 eV. Thus, ferrocene has a work function of 3.69 eV, which is lower than that of metal silver (the work function of which is 4.26 eV) typically used as the cathode 11 of the OLED device. Therefore, in the case that the cathode 11 of the OLED device is made of ferrocene, which is helpful for improving the transmission performance of electrons, so that the electrons can be injected into the functional layer more efficiently in the light-emitting process of the OLED device.

In addition, the organic conductive material comprising a ferrocenyl group, for example, 1,1'-dilithioferrocene produced by the reaction of ferrocene with n-butyllithium, has a lower work function than ferrocene because the elementary metal lithium has a work function of 2.9 eV. Thus, in the case that the cathode 11 is made of 1,1'-dilithioferrocene, a better effect can be achieved.

Second Embodiment

Figure 3:
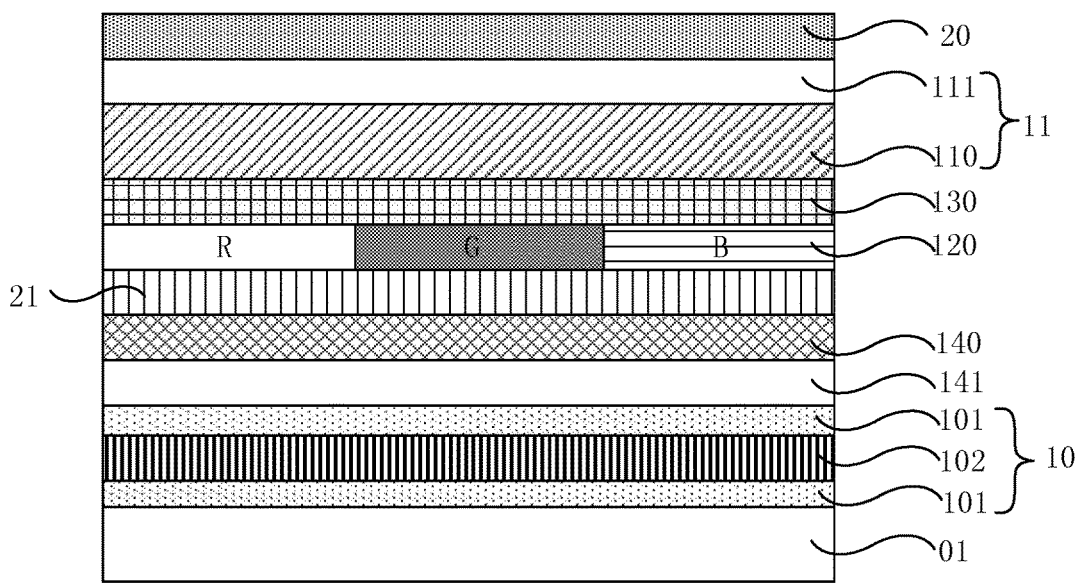
FIG. 3 is another schematic structure diagram of the OLED device provided by an embodiment of the present disclosure.

The organometallic layer 110 (for example, ferrocene or an organic conductive material comprising the ferrocenyl group) can be used as the cathode 11 in the first embodiment. However, the cathode 11 in the present embodiment is composed of two or more thin film layers. As shown in FIG. 3, in addition to the organometallic layer 110, the cathode 11 further comprises a cathode metal layer 111, and the cathode metal layer 111 is disposed on a side of the organometallic layer 110 away from the anode 10 and connected to the organometallic layer 110 to improve the conductivity of the cathode 11. Besides, the organometallic layer 110 disposed on a side close to a light-emitting layer 120 can effectively improve the ability of electron injection. In order to improve the efficiency of electron injection, the metal for forming the cathode metal layer 111 includes metal elements having low work functions, for example, the metal is at least one selected from the group consisting of: silver (work function: 4.26 eV), magnesium (work function: 3.68 eV), aluminum (work function: 4.28 eV), calcium (work function: 2.9 eV), lithium (work function: 2.9 eV) or gadolinium (work function: 3.1 eV). The metal element magnesium has a low work function and the metal element silver has stable chemical properties. Therefore, in some embodiments, the cathode metal layer 111 is made of silver-magnesium alloy (Mg/Ag).

Consequently, because the cathode metal layer 111 has a high conductivity and the organometallic layer 110 has a high transmittance, a high stability and a low cost. Therefore, the cathode 11 provided in the present embodiment not only has a high conductivity, but also has a high transmittance, a high stability and a low cost.

It should be noted that, firstly, because the cathode 11 in the embodiments of the present disclosure has a low work function, thus the electrodes injection efficiency can be improved, therefore, it is unnecessary to provide an electron injection layer 131 in the OLED device, that is to say, in some embodiments, the OLED device does not comprise an electron injection layer. Thus, the thickness of the OLED device can be reduced, which is helpful for the ultra-thin design of the display device.

Secondly, as shown in FIG. 3, an electron blocking layer 21 can be further provided between the light-emitting layer 120 and the hole transport layer 140 to prevent electrons from entering the hole transport layer 140.

Thirdly, in an embodiment provided in the present disclosure, the thickness of the organometallic layer 110 is greater than 50 Å, for example from 50 Å to 100 Å. In the case that the thickness of the organometallic layer 110 is less than 50 Å, because the thickness is too small, the abilities of the organometallic layer 110 of transporting electrons and transmitting light are reduced. In the case that the thickness of the organometallic layer 110 is greater than 100 Å, although the ability of transporting electrons is improved, the thickness of the OLED device is increased because the thickness is too great, which is unfavorable for the ultra-thin design of the OLED device.

Fourthly, in an embodiment provided in the present disclosure, the anode 10, for example, is made of a metal element with a single layer. In order to reduce the production cost, the anode 10 may also be made of a transparent conductive material such as indium zinc oxide or indium tin oxide (ITO). The anode 10 made of a metal element has better conductivity than the anode 10 made of the above transparent conductive material. Thus, the anode 10 can be made of various thin film layers. Specifically, as shown in FIG. 3, the anode 10 comprises two transparent conductive layers 101 and an anode metal layer 102 disposed between the two transparent conductive layers 101. The anode metal layer 102 may be made of silver metal element having a great work function, and the transparent conductive layer 101 is made of the above transparent conductive material. In this case, on the one hand, the conductivity of the anode 10 is improved by the anode metal layer 102, and the production cost of the anode 10 is reduced by the transparent conductive layer 101. On the other hand, for the top emission type OLED device, as shown in FIG. 3, the light emitted from the light-emitting layer 120 can be reflected by the anode metal layer 102, thereby the utilization of the light is improved.

An embodiment of the present disclosure provides a display apparatus, and the display apparatus comprises any one of the OLED devices as described above. The display apparatus has the same structure and beneficial effects as the OLED device provided in the preceding embodiments. The structure and beneficial effects of the OLED device have been described in detail in the preceding embodiments, and detailed descriptions will be omitted here.

It should be noted that, OLED devices can be divided into PMOLED (Passive Matrix OLED, passive matrix organic light-emitting diode) devices and AMOLED (Active Matrix OLED, active matrix organic light-emitting diode) devices according to the driving mode. PMOLED devices have some disadvantages when applied to large-size displays, thus the display devices provided in some embodiments of the present disclosure are active matrix type OLED devices. That is, as shown in FIG. 4, the OLED devices further comprises a thin film transistor 30, the drain electrode 301 of the thin film transistor 30 is connected to the anode, for example, the drain electrode 301 of the thin film transistor 30 is connected to the transparent conductive layer 101 which forms an anode 10 and is close to a side of the thin film transistor 30 in the top emitting OLED device as shown in FIG. 3.

Figure 4:
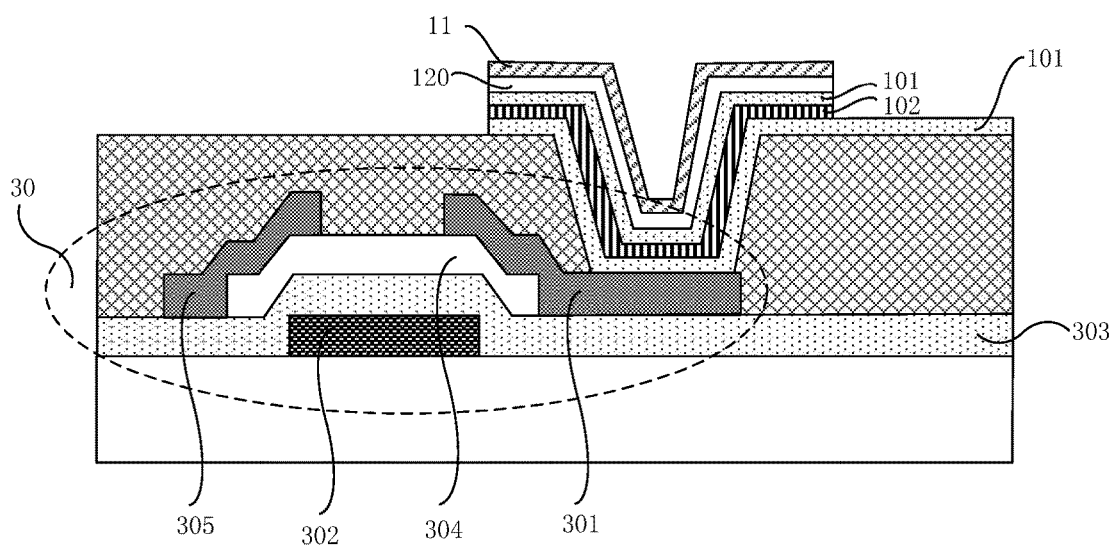
FIG. 4 is a schematic structure diagram of a display apparatus provided by an embodiment of the present disclosure.

The thin film transistor 30 comprises a gate electrode 302, a gate insulation layer 303, a semiconductor active layer 304, a source electrode 305, and a drain electrode 301; and the thin film transistor 30 may be a top gate type, or a bottom gate type as shown in FIG. 4. The OLED device further comprises a gate line and a gate lead line (not shown in the figure) and the like electrically connected to the gate electrode 302, and a data line, a data lead line (not shown in the figure) and the like electrically connected to the source electrode 305.

Figure 5:
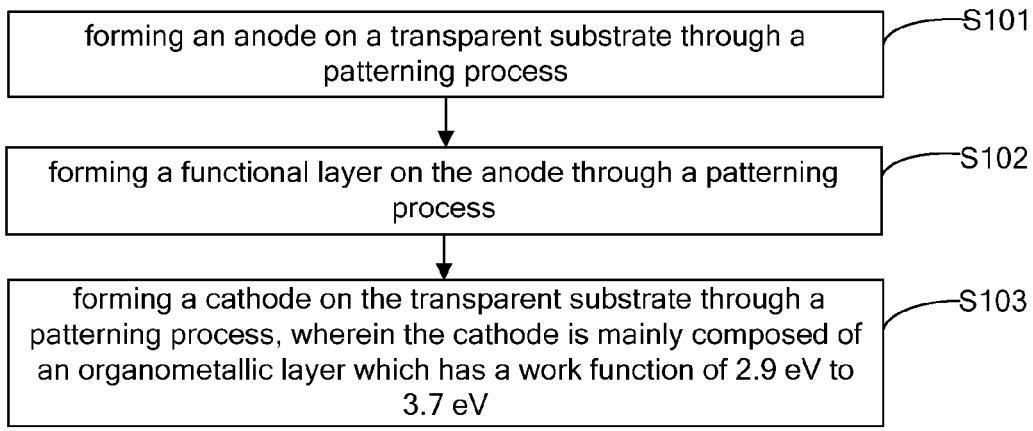
FIG. 5 is a flow chart of a manufacturing method of an OLED device provided by an embodiment of the present disclosure.

An embodiment of the present disclosure provides a manufacturing method of the OLED device, as shown in FIG. 5, the method comprises the following operations:

S101. forming an anode 10 as shown in FIG. 1 on a transparent substrate 01 through a patterning process;

S102. forming a functional layer 12 on the anode 10 through a patterning process;

S103. forming a cathode 11 on the transparent substrate 01 (the transparent substrate 01 on which the functional layer 12 is formed) through a patterning process, wherein the cathode 11 is mainly composed of an organometallic layer 110 which has a work function of 2.9 eV to 3.7 eV.

The patterning process in the embodiments of the present disclosure includes a photolithographic process, or includes a photolithographic process and an etching step, and may also include other processes for forming a predetermined pattern, such as printing, ink-jetting, etc.; the photolithographic process includes film forming, exposing, developing and the like, specifically processes of forming a pattern by using photoresist, a mask plate, an exposure machine and the like. The corresponding patterning process may be selected according to the structure formed in the present disclosure.

The transparent substrate 01 described above may be made of a hard material such as a glass substrate, a hard resin substrate, or a transparent substrate made of a flexible material. Furthermore, the preparation of various thin film layers on the transparent substrate 01 in the above steps can be carried out either directly on the surface of the transparent substrate 01 or on the transparent substrate 01 on which some thin film layers or patterns of thin film layers have been formed. For example, in step S103, forming a cathode 11 on the transparent substrate 01 through a patterning process means that a cathode 11 is formed through a patterning process on the transparent substrate 01 on which the functional layer 12 is formed.

An embodiment of the present disclosure provides a manufacturing method of the OLED device, and the method includes forming a cathode on the transparent substrate through a patterning process, and the cathode is mainly composed of an organometallic layer having a work function of 2.9 eV to 3.7 eV. Thus, in one aspect, in the case that the OLED device is a top emission type, the luminous efficiency of the OLED device can be improved by using the organometallic layer having a high transmittance as the cathode compared with the cathode made of metal elements or alloys. In another aspect, the luminous principle of the OLED device is that electrons and holes are injected from the cathode and the anode respectively and then combined in the functional layer to generate excitons for luminescence. Because the organic material for forming the functional layer has a small electron affinity, in the case that the work function of the organometallic layer ranges from 2.9 eV to 3.7 eV, the cathode made of the organometallic layer has a small work function, which is helpful for improving the transmission performance of electrons, so that the electrons can be injected into the functional layer more efficiently in the light-emitting process of the OLED device. In a still further aspect, the organometallic layer has a lower cost and more stable chemical properties than metal elements or alloys.

Figure 6:
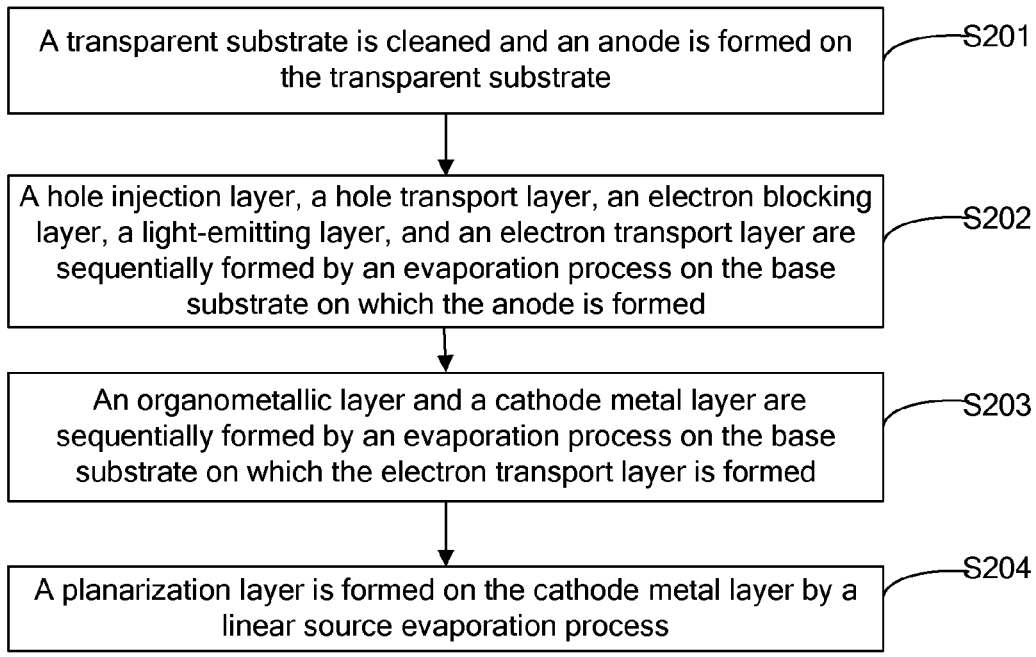
FIG. 6 is another flow chart of a manufacturing method of an OLED device provided by an embodiment of the present disclosure.

The manufacturing method of the OLED device will be exemplified in detail with reference to the following specific embodiments, and the method is shown in FIG. 6.

Third Embodiment

S201. A transparent substrate 01 is cleaned and an anode 10 is formed on the transparent substrate 01.

Specifically, a transparent conductive layer 101 having a thickness of 50 Å to 100 Å and an anode metal layer 102 having a thickness of 900 Å to 1100 Å as shown in FIG. 3 are sequentially deposited on the transparent substrate 01 using a sputtering apparatus, a metal element silver can be used to form the above anode metal layer and another transparent conductive layer 101 having a thickness of 50 Å to 100 Å.

In this way, on the one hand, the conductivity of the anode 10 can be improved by the anode metal layer 102, and the production cost of the anode 10 is reduced by the transparent conductive layer 101. On the other hand, for the top emission type OLED device as shown in FIG. 3, the light emitted from the light-emitting layer 120 can be reflected by the anode metal layer 102, thereby the utilization of the light is improved.

S202. A hole injection layer 141, a hole transport layer 140, an electron blocking layer 21, a light-emitting layer 120, and an electron transport layer 130 as shown in FIG. 3 are sequentially formed by an evaporation process on the base substrate on which the anode 10 is formed.

Specifically, the base substrate on which the anode 10 is formed may be placed in a linear source evaporation chamber, and a heating and evaporation process is employed to form a hole injection layer 141 having a thickness of 50 Å to 100 Å; a hole transport layer 140 having a thickness of 1000 Å to 1200 Å; an electron blocking layer 21 having a thickness of 50 Å to 120 Å; a light-emitting layer 120 comprised of a red (R) light-emitting unit having a thickness of 850 Å to 950 Å, a green (G) light-emitting unit having a thickness of 700 Å to 750 Å, and a blue (B) light-emitting unit having a thickness of 200 Å to 250 Å; and an electron transport layer 130 having a thickness of 250 Å to 300 Å sequentially.

S203. An organometallic layer 110 and a cathode metal layer 111 as shown in FIG. 3 are sequentially formed by an evaporation process on the base substrate on which the electron transport layer 130 is formed.

Specifically, the base substrate on which the electron transport layer 130 is formed may be placed in a point source evaporation chamber, and the organometallic layer 110 made of ferrocene or an organic conductive material comprising a ferrocenyl group is evaporated under vacuum conditions at a temperature of 100° C. to 240° C. Ferrocene has a work function of 3.69 eV, which is lower than that of metal silver (work function: 4.26 eV) typically used as the cathode 11 of the OLED device. Therefore, in the case that the cathode 11 of the OLED device is made of ferrocene, which is helpful for improving the transmission performance of electrons, so that the electrons can be injected into the functional layer more efficiently in the light-emitting process of the OLED device.

In addition, the organic conductive material comprising a ferrocenyl group, for example, 1,1'-dilithioferrocene produced by the reaction of ferrocene with n-butyllithium, has a lower work function than ferrocene because the elementary metal lithium has a work function of 2.9 eV. Thus, in the case that the cathode 11 is made of 1,1'-dilithioferrocene, a better effect can be achieved.

The above organometallic layer 110 may have a thickness of 50 Å to 100 Å. In the case that the thickness of the organometallic layer 110 is less than 50 Å, because the thickness is too small, the abilities of the organometallic layer 110 of transporting electrons and transmitting light are reduced. In the case that the thickness of the organometallic layer 110 is greater than 100 Å, although the ability of transporting electrons is improved, the thickness of the OLED device is increased because the thickness is too great, which is unfavorable for the ultra-thin design of the OLED device.

Then, the cathode metal layer 111 having a thickness of 120 Å to 160 Å is evaporated on the organometallic layer 110. The metal element magnesium has a low work function and the metal element silver has stable chemical properties. Therefore, in some embodiments, the cathode metal layer 111 described above is made of silver-magnesium alloy (Mg/Ag). In the case that the cathode metal layer 111 has a thickness less than 120 Å, the conductivity of the cathode 11 will be reduced, and in the case that the cathode metal layer 111 has a thickness greater than 160 Å, the thickness of the OLED device will be increased, which is unfavorable for the ultra-thin design of the OLED display.

It should be noted that, the point source evaporation process in this step is suitable for deposition of expensive raw materials because the point source evaporation process has a lower deposition rate and requires less materials than the line source evaporation process in step S202.

S204. A planarization layer 20 (CPL) is formed on the cathode metal layer 111 by a linear source evaporation process.

The planarization layer 20 has a thickness of 1000 Å to 1100 Å, and thus the flatness of the surface of the OLED device can be improved.

In the OLED device formed by the above method, the cathode 11 is composed of the cathode metal layer 111 and the organometallic layer 110, and the anode 10 is composed of the anode metal layer 102 and the transparent conductive layers 101 disposed on two sides of the anode metal layer 102. In this way, in one aspect, in the case that the OLED device is a top emission type device, the cathode 11 comprises a metal element or an alloy, which can improve the conductivity of the cathode 11, and the cathode 11 further comprises an organometallic layer, which can improve the luminous efficiency of the OLED device; furthermore, the organic material of the functional layer has a small electron affinity, which helps to improve the transport performance of electrons, so that the electrons can be injected into the functional layer more efficiently in the light-emitting process of the OLED device. In another aspect, the organometallic layer has a lower cost and more stable chemical properties than a metal element or an alloy. In a still further aspect, the anode 10 comprises an anode metal layer 102, which can improve the conductivity of the anode 10, and the anode 10 further comprises a transparent conductive layer 101, which can reduce the production cost of the anode 10. In addition, for the top emission type OLED device, the light emitted from the light-emitting layer 120 can be reflected by the anode metal layer 102, thereby the utilization of the light is improved.

What are described above is related to the illustrative embodiments of the disclosure only and not limitative to the scope of the disclosure; the scopes of the disclosure are defined by the accompanying claims.

The present application claims the priority of the Chinese Patent Application No. 201510280602.1 filed on May 27, 2015, which is incorporated herein by reference as part of the disclosure of the present application.

What is claimed is:

1. An organic light emitting diode (OLED) device, comprising an anode, a cathode, and a functional layer disposed between the anode and the cathode,
wherein the cathode comprises an organometallic layer, and the organometallic layer comprises an organic metal;
the organic metal is at least one selected from the group consisting of: ferrocene or an organic conductive material comprising a ferrocenyl group;
the anode comprises two transparent conductive layers and an anode metal layer disposed between the two transparent conductive layers.

2. The OLED device according to claim 1, wherein a work function of the organometallic layer ranges from 2.9 eV to 3.7 eV.

3. The OLED device according to claim 1, wherein the cathode further comprises a cathode metal layer, and the cathode metal layer comprises a metal.

4. The OLED device according to claim 3, wherein the cathode metal layer is disposed on a surface of the organometallic layer away from the anode, and the cathode metal layer is in direct contact with the organometallic layer.

5. The OLED device according to claim 3, wherein the cathode metal layer comprises at least one of: silver, magnesium, aluminum, calcium, lithium, or gadolinium.

6. The OLED device according to claim 1, wherein a thickness of the organometallic layer ranges from 50 Å to 100 Å.

7. The OLED device according to claim 1, wherein the functional layer comprises a light-emitting layer.

8. The OLED device according to claim 7, wherein the functional layer further comprises at least one selected from the group consisting of: an electron injection layer, an electron transport layer, a hole injection layer or a hole transport layer.

9. A display apparatus, comprising the OLED device according to claim 1.

10. A manufacturing method of an organic light emitting diode (OLED) device, comprising:
forming an anode, a cathode, and a functional layer disposed between the anode and the cathode on a base substrate through a patterning process,
wherein the cathode comprises an organometallic layer, and the organometallic layer comprises an organic metal;
the organic metal is at least one selected from the group consisting of: ferrocene or an organic conductive material comprising a ferrocenyl group;
the anode comprises two transparent conductive layers and an anode metal layer disposed between the two transparent conductive layers.

11. The method according to claim 10, wherein a work function of the organometallic layer ranges from 2.9 eV to 3.7 eV.

12. The method according to claim 10, wherein the base substrate is a transparent substrate.

13. The method according to claim 10, wherein the organometallic layer is formed on the base substrate through a patterning process, and a thickness of the organometallic layer ranges from 50 Å to 100 Å.

14. The method according to claim 13, wherein a cathode metal layer is further formed on the organometallic layer through a patterning process, and a thickness of the cathode metal layer ranges from 120 Å to 160 Å.

15. The OLED device according to claim 4, wherein the cathode metal layer comprises at least one of: silver, magnesium, aluminum, calcium, lithium, or gadolinium.

* * * * *